(12) United States Patent
Miller et al.

(10) Patent No.: US 9,506,970 B2
(45) Date of Patent: Nov. 29, 2016

(54) METHOD FOR CHARACTERIZING THE SENSITIVITY OF ELECTRONIC COMPONENTS TO DESTRUCTIVE MECHANISMS

(75) Inventors: Florent Miller, Courbevoie (FR); Sebastien Morand, Boulogne Billancourt (FR)

(73) Assignee: AIRBUS GROUP SAS, Paris (FR)

( * ) Notice: Subject to any disclaimer, the term of this patent is extended or adjusted under 35 U.S.C. 154(b) by 381 days.

(21) Appl. No.: 13/807,889

(22) PCT Filed: Jun. 30, 2011

(86) PCT No.: PCT/EP2011/061034
§ 371 (c)(1),
(2), (4) Date: Dec. 31, 2012

(87) PCT Pub. No.: WO2012/001119
PCT Pub. Date: Jan. 5, 2012

(65) Prior Publication Data
US 2013/0099774 A1    Apr. 25, 2013

(30) Foreign Application Priority Data
Jul. 1, 2010    (FR) ..................................... 10 55292

(51) Int. Cl.
*G01R 13/38*    (2006.01)
*G01R 31/00*    (2006.01)
(Continued)

(52) U.S. Cl.
CPC ......... *G01R 31/002* (2013.01); *G01R 31/2848* (2013.01); *G01R 31/2849* (2013.01);
(Continued)

(58) Field of Classification Search
CPC ..... H01L 21/00; H01L 2221/00; G01B 1/00; G01B 2210/00; G01J 1/00

USPC ......... 324/97, 464, 468, 469, 461, 501, 559, 324/71.3, 71.5
See application file for complete search history.

(56) References Cited

U.S. PATENT DOCUMENTS 4,572,954 A * 2/1986 Josephson ............... G01T 1/026
                                                              250/370.07
8,299,767 B1 * 10/2012 Tuozzolo ........... H03K 17/0822
                                                              323/275
(Continued)

OTHER PUBLICATIONS

Lindberg et. al (Detailed Comparison of Monte Carlo and Sector-Shielding Analyses for Space Applications, IEE Transactions on Nuclear Science, vol. 53, No. 6, Dec. 2006.*
(Continued)

*Primary Examiner* — Jermele M Hollington
*Assistant Examiner* — Temilade Rhodes-Vivour
(74) *Attorney, Agent, or Firm* — IM IP LAW PLLC; C. Andrew Im

(57) ABSTRACT

A method for characterizing the sensitivity of an electronic component with respect to a natural radiating environment. The safe operating area (SOA) voltage range beyond which destructive events occur is determined for the electronic component for given characteristics of a particle or incident beam. The electronic component is turned on and energized with the particle or incident beam having the given characteristics under the operating conditions that are close to the highest voltage value of the determined SOA voltage range. An efficient section of amplified transient events, which corresponds to an estimation of the destructive occurrences for the electronic component is determined. The characteristics of the particle or beam is modified and the method is repeated with the modified characteristics.

20 Claims, 4 Drawing Sheets

(51) Int. Cl.
*G01R 31/28* (2006.01)
*G01B 1/00* (2006.01)
*H01L 21/00* (2006.01)
*G01R 31/311* (2006.01)
*G01R 31/3181* (2006.01)

(52) U.S. Cl.
CPC ............ *G01R31/2881* (2013.01); *G01B 1/00* (2013.01); *G01R 31/311* (2013.01); *G01R 31/31816* (2013.01); *H01L 21/00* (2013.01); *H01L 2221/00* (2013.01)

(56) References Cited

U.S. PATENT DOCUMENTS

| | | | | |
|---|---|---|---|---|
| 2004/0135081 | A1* | 7/2004 | Larson et al. | 250/305 |
| 2007/0019282 | A1* | 1/2007 | Weiner | G02F 2/002 359/326 |
| 2008/0142899 | A1* | 6/2008 | Morris et al. | 257/371 |
| 2008/0266984 | A1* | 10/2008 | Chen | G01R 31/31816 365/189.02 |
| 2009/0031308 | A1* | 1/2009 | Busche | G06F 9/542 718/101 |
| 2009/0106012 | A1* | 4/2009 | Liu | H04L 63/20 703/21 |

OTHER PUBLICATIONS

Luu et al, *SEB Characterization of Commercial Power MOSFETs With Backside Laser and Heavy Ions of Different Ranges*, IEEE Transactions on Nuclear Science, vol. 34, No. 4, Aug. 1, 2008, pp. 2166-2173, IEEE Service Center, New York, NY, USA.

Luu et al, *SEB Characterization of Commercial Power MOSFETs With Backside Laser and Heavy Ions of Different Ranges*, RADECS 2007, 9th European Conference, Sep. 10, 2007, pp. 1-7, IEEE, Piscataway, NJ, USA.

Miller et al, *Characterization of Single-Event Burnout in Power MOSFET Using Backside Laser Testing*, IEEE Transactions on Nuclear Science, vol. 53, No. 6, Dec. 1, 2006, pp. 3145-3152, IEEE Service Center, New York, NY, USA.

Hubert et al, *A Review of DASIE Code Family: Contribution to SEU/MBU Understanding*, On-Line testing Symposium 2005, Jul. 6-8, 2005, pp. 87-94, IEEE, Piscataway, NJ, USA.

Buard et al., *Effects of Beam Spot Size on the Correlation Between Laser and Heavy Ion SEU Testing*, IEEE Transactions on Nuclear Science, vol. 51, No. 6, Dec. 1, 2004, IEEE Service Center, New York, NY USA.

Coss et al., *Compendium of single event failures in power MOSFETs*, Radiation Effects Data Workshop 1998, Jul. 24, 1998, pp. 15-38 IEEE, New York, NY, USA.

* cited by examiner

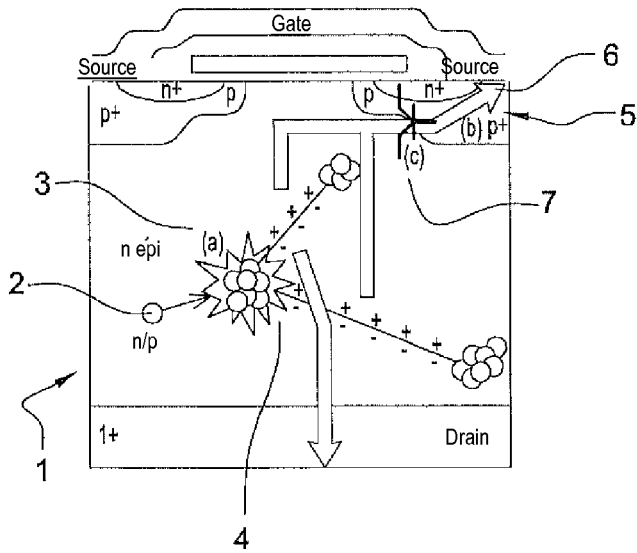
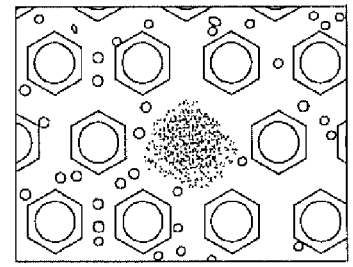
Fig. 1
Fig. 2
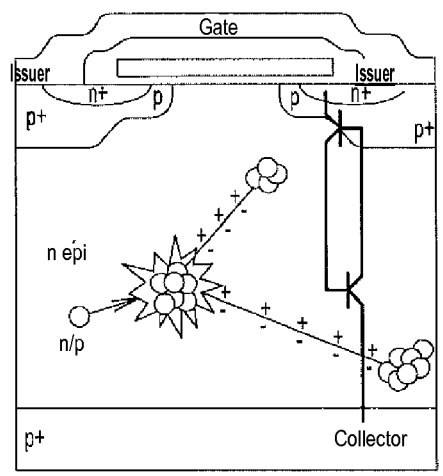
Fig. 3
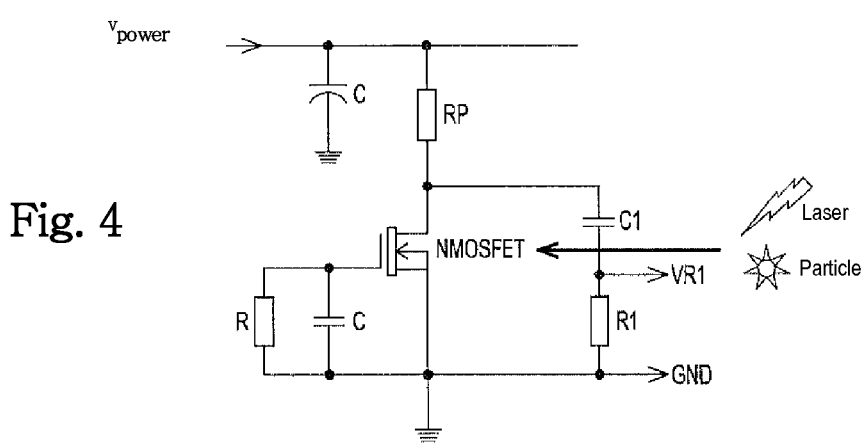
Fig. 4

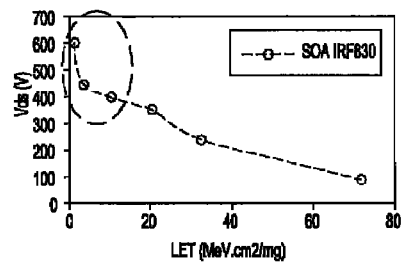 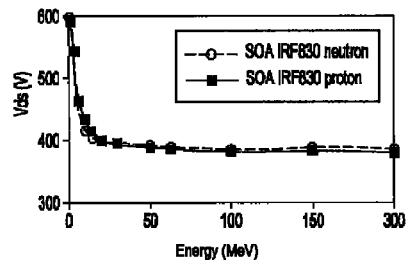
Fig. 8a  Fig. 8b
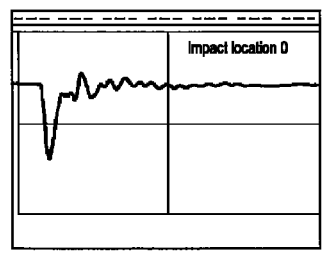 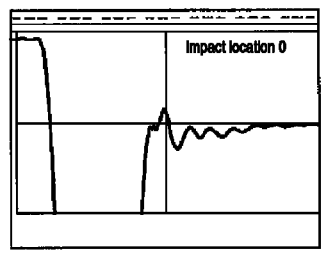
FFig. 9a    Fig. 9b
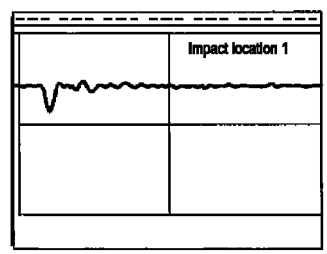 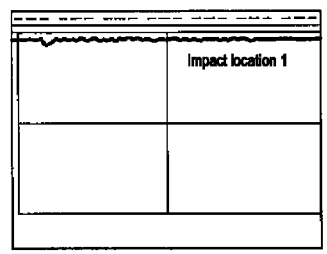
Fig. 9c    Fig. 9d

METHOD FOR CHARACTERIZING THE SENSITIVITY OF ELECTRONIC COMPONENTS TO DESTRUCTIVE MECHANISMS

RELATED APPLICATIONS

This application is a §371 application from PCT/EP2011/061034 filed Jun. 30, 2011, which claims priority from French Patent Application No. 10 55292 filed Jul. 1, 2010, each of which is incorporated herein by reference in its entirety.

TECHNICAL FILED OF THE INVENTION

This invention relates to a method for characterizing the sensitivity of electronic components to destructive mechanisms. One purpose of the invention is to determine the sensitivity of power components to the natural radiation environment, in other words, heavy ion, neutron, and proton particles or any other phenomena leading to the generation of charges by direct or indirect interaction in the electronic components, so as to determine the component's preferred operating conditions.

BACKGROUND OF THE INVENTION

The operation of power components can be disrupted by the environment in which they operate, e.g., an artificial or natural radiation environment or an electromagnetic environment. Harmful external factors trigger the creation of parasitic currents by interacting with the material that makes up the component. These may cause the temporary or permanent malfunction of the component and the application that uses it.

Natural or artificial radiation environments (neutrons, protons, heavy ions, flash x-rays, and gamma rays) can disrupt the operation of power components. Such disruptions are due to interactions between the material in the component and particles in the radiation environment. One consequence of these disruptions is the creation of parasitic currents in the component. The size of the resulting parasitic currents depends on where the interactions between the component's material and the particles take place. This produces localized areas where charges collect in the component.

Such attacks by heavy ions and protons are typically encountered, in space, by satellites and launch vehicles. At the lower altitudes where airplanes operate, there is an especially high presence of attacks by neutrons. At sea level, such attacks may also be encountered and may affect onboard electronic components in portable device, or in vehicles.

Power components, such as "power MOSFET" transistors and IGBTs, intrinsically have parasitic bipolar structures. During normal operation of the power component, these parasitic bipolar structures are inactive. When a particle from the natural radiation environment interacts with the component's material, a parasitic current is generated and may make the parasitic bipolar structures busy (shown in FIG. 1).

As shown in FIG. 1, in an N-channel power MOSFET transistor 1, the positive charges created during the particle 2/material 4 interaction 3 will migrate toward the well contact 5 as a result of electric fields and diffusion mechanisms. By moving, these positive charges will generate potential increases locally. Initially blocked, the Source (N)/Wells (P) junction 6 can then be polarized directly.

When blocked, if the well/drain junction is already reverse biased, the Source/Wells/Drain parasitic bipolar transistor 7 becomes busy.

In this situation, a second mechanism is then implemented. This mechanism is called an avalanche mechanism, and it produces additional charges at the well/drain junction with a maximum electric field value. If the electric field conditions are sufficient and the current output is not otherwise reduced, the avalanche mechanism and the injection of carriers by the bipolar transistor are maintained and amplified until the increase in temperature locally following the passage of the current causes physical damage to the component. FIG. 2 is an example of such damage.

Such failures are common to power IGBT and MOSFET structures.

For IGBTs in particular, there is also another, more common component failure known as "latchup". This "latchup" phenomenon involves the conduction of a parasitic thyristor with an NPNP structure, which exists only in IGBTs and not in MOSFETs, as shown in FIG. 3.

Additionally, for other power structures like diodes, there is no parasitic bipolar structure, but the conditions of the electric field are such that they may still cause a destructive avalanche effect during particle interaction or any other interaction resulting in the generation of charges.

The laser is mainly used as a tool for pre-characterizing the sensitivity of the components to radiation. Like particles in the radiation environment, the laser can generate parasitic currents within components at the appropriate wavelength.

The laser thus provides a very interesting advantage for studying the effect of radiation. Because the spatial resolution of the laser can reach relatively small sizes relative to the basic structures contained in the electronic components, it is possible, as in the case of ion microbeams, to map an electronic component and identify its areas where charges are collected. By varying the beam's focal depth, 3D sensitivity mapping can also be carried out, which is easy using machines.

However, this knowledge is not enough to understand the total behavior of the electronic component with respect to radiation.

The prior art therefore provides a method to overcome this problem by determining the sensitivity of electronic components by means of simulation. Once the component's sensitivity mapping has been established, it is modeled, often as a matrix with four or five dimensions, with X Y Z and a sensitivity coefficient or with X Y Z T and a sensitivity coefficient. The component model is then subjected to a simulated attack, and its simulated response is measured. For example, schematically, if at a given time T, a simulated ion (either a primary ion or an ion produced from a nuclear reaction) passes through a basic area with XYZ coordinates, and if, at that time, that same basic area has a sensitivity s, the quality value s is assigned to the component. This experiment is then repeated for another simulated ion. Therefore, over a given period of study, as the time varies and the application initiated by the component runs, the values are collected and, then, perhaps after a given measurement duration, the measured quality values are compiled to determine the actual quality of the component. By doing this, rather than having a map that is subject to speculation, we get a true measure of quality.

OBJECT AND SUMMARY OF THE INVENTION

This invention involves the SOA voltage range (the highest voltage by lower value). For the characteristics of the given incident beam or particle, the SOA ("Safe Operating Area") is the range of voltage beyond which destructive events may be triggered. Working within this range ensures that the test will not be destructive, even if no protection is used. This invention proposes to work on events (transient events) triggered when working in the SOA. By definition, these signals are different from the signals observed outside of the SOA, for which the test is destructive but which are of interest for determining the sensitivity of the power component. This invention is then based on a link between the transient signals and the destructive signals of interest.

The following scientific publications are known in the prior art:

"SEB Characterization of Commercial Power MOSFETs with Backside Laser and Heavy Ions of Different Ranges" (LUU A et al, IEEE Transactions on Nuclear Science, vol. 34, no. 4, Aug. 1, 2008);

"SEB Characterization of Commercial Power MOSFETs with Backside Laser and Heavy Ions of Different Ranges" (LUU A et al, Radiation and its Effects on Components and Systems, RADECS 2007, pages 1-7, Sep. 10, 2007); and "Characterization of Single-Event Burnout in Power MOSFET Using Backside Laser Testing" (MILLER F et al, IEEE Transactions on Nuclear Science, vol. 53, no. 6, Dec. 1, 2006).

These three documents from the prior art reflect tests performed outside of the SOA, which corresponds to the prior art, and which, by definition, are destructive if no protection is used. Even with protection, some of these events may be destructive. The fundamental difference between this invention and these three documents from the prior art is therefore the working range in which the test is performed. In this invention, the component is turned on in its SOA, and for the three cited documents from the prior art, it is turned on outside of its SOA.

These three documents from the prior art neither disclose not suggest exciting the electronic component turned on with the characteristics of the incident beam or particle, under operating conditions similar to the highest voltage in the determined SOA voltage.

The characterization of the sensitivity of the power components to destructive events triggered by radiation is difficult to obtain by the usual means of characterization mentioned above. An exhaustive characterization requires testing the sensitivity for multiple voltage levels and multiple energy/LET levels of the incident particle.

Furthermore, the experimental test of the component, which is based on a laser or on a beam of particles, is often destructive because of the significant amount of energy stored inside, despite the use of assemblies that limit the effects of current amplification commonly implemented. By an assembly that limits the effects of current amplification, this means the use of a resistor to limit the power current and possibly a discharge capacitor to provide a more significant peak current, so as to more easily discern transient events of destructive elements.

Because of these limitations, particle beam tests require using many parts to acquire sufficient event statistics, and they are very time-consuming, which involves a very high cost associated with the test campaign.

The purpose of the invention is to overcome this problem by proposing to use a method for characterizing the sensitivity of a power component to destructive mechanisms. In this sense, the invention provides a combined use of an electric component characterization system, a test method, and possibly, to improve the accuracy of the results, a laser test means, and to extrapolate the results of other types of particles, a code for predicting radiation. The invention allows the sensitivity to destructive events to be characterized for test conditions under which the component is found in a secure area called an SOA. This destructive event analysis is based on the analysis of precursor transient events.

The invention therefore relates to a method for characterizing the sensitivity of an electronic component to a natural radiation environment, in which:

the electronic component is turned on, wherein, for the characteristics of a given incident beam or particle, such as energy and/or incidence and/or path and/or others, an SOA voltage range is determined, beyond which events that are destructive to the component may take place, the electronic component is excited and thus turned on with the characteristics of the incident beam or particle, under operating conditions similar to the highest voltage in the determined SOA voltage range, an effective section of amplified transient events is determined, this effective section corresponding to an estimate of phenomena that are destructive to said component, the characteristics of said particle or said beam are modified, and the excitation of said component is repeated, the effective section is determined for each modification to the characteristics.

The invention includes any one of the following characteristics:

when determining the effective section, the test conditions are applied to said component, said conditions being polarizations, dynamic operating conditions such as frequency, the duty cycle ratio, or environment conditions, such as the temperature;

to determine a component's SOA voltage range, we determine the electrical characteristics that change the current of an output electrode of said component based on the voltage applied to said output electrode, when the component is in a blocked state;

we measure the probability of failures for which the component allows an operating failure, from the determined effective sections;

the excitation is performed using laser radiation or by means of a particle accelerator or any other means of injecting charges;

the destructive phenomena are SEB, latchup, or any other phenomena that risk triggering a parasitic bipolar structure and/or triggering maintenance mechanisms and/or amplifying the current;

use of an estimation of the effective section by entering a prediction code;

the prediction code is a prediction code like SMC DASIE.

The purpose of the invention is also a test device comprising a measurement device, and a processor to implement the method described above.

BRIEF DESCRIPTION OF THE DRAWINGS

The invention will be better understood upon reading the following description and studying the figures that accompany it. They are presented for illustrative purposes only and are not limiting to the invention. The figures show:

FIG. 1: A schematic representation of a power MOSFET transistor and a parasitic bipolar structure;

FIG. 2: A schematic representation of a destructive event triggered by a particle in a power MOSFET type structure;

FIG. 3: A schematic representation of a parasitic thyristor in the IGBT components;

FIG. 4: A schematic representation of an assembly for testing the sensitivity of power components to radiation according to the prior art;

FIGS. 8a-8b: Graphs predicting the sensitivity of a component in heavy ion, neutron, and proton environments, according to one embodiment of the invention;

FIGS. 9a-9d: Representation of events triggered by the laser for test conditions in and out of the SOA voltage range, according to one embodiment of the invention;

DETAILED DESCRIPTION OF THE EMBODIMENTS

According to one embodiment of the invention, the characterization of the sensitivity of a power component is carried out in two steps.

A first step is a characterization of the voltage range for which destructive events may take place in a power component subject to particles or radiation of given characteristics. This voltage range is called SOA, for "Safe Operating Area". The SOA voltage range is the interval of voltages for which the component does not have destructive failures (or destructive phenomena) when it is subjected to particles or radiation of given characteristics (including energy, path in the material, etc.)

This voltage range is restricted to the VSOA voltage that represents the highest voltage for which the component does not have destructive failures, for the characteristics of the incident radiation or particle. Above a certain level of drain source polarization (for a power MOSFET transistor), the combination of characteristics of the particle and the electrical conditions inside the power component are such that avalanche amplification mechanisms may be triggered and are maintained until they reach the component's electrical and then thermal breaking point.

A second step is a characterization of the probability of the avalanche phenomenon occurring. This probability of this phenomenon occurring depends on the characteristics of the particle and on the test conditions applied to the component, including polarization, frequency, temperature, dynamic performance, etc.

The destructive phenomena of the power components, such as the maintenance of an SEB ("Single Event Burn-out") parasitic current and a triggering of a parasitic thyristor, called a latchup or SEL ("Single Event Latchup"), trigger only when the component is in a blocked state or switching. As an example, the gate voltage in such conditions is either null or negative for a N-channel power MOS transistor.

To characterize the voltage range for which destructive events may take place, it is necessary to determine the electrical characteristics that change the current of an output electrode of said component based on the voltage applied to said output electrode, when the component is in a blocked state.

In the case of a power MOSFET transistor, the variation to the drain current is determined based on the drain source voltage, when the gate source voltage is null or negative.

In the case of an IGBT, the variation to the collector current is determined based on the collector's voltage, when the gate source voltage is null or negative.

Similarly, for other types of power components (diodes, thyristors, etc.), the variation to the output electrode current is determined based on the voltage applied to the electrode.

Figure 5:
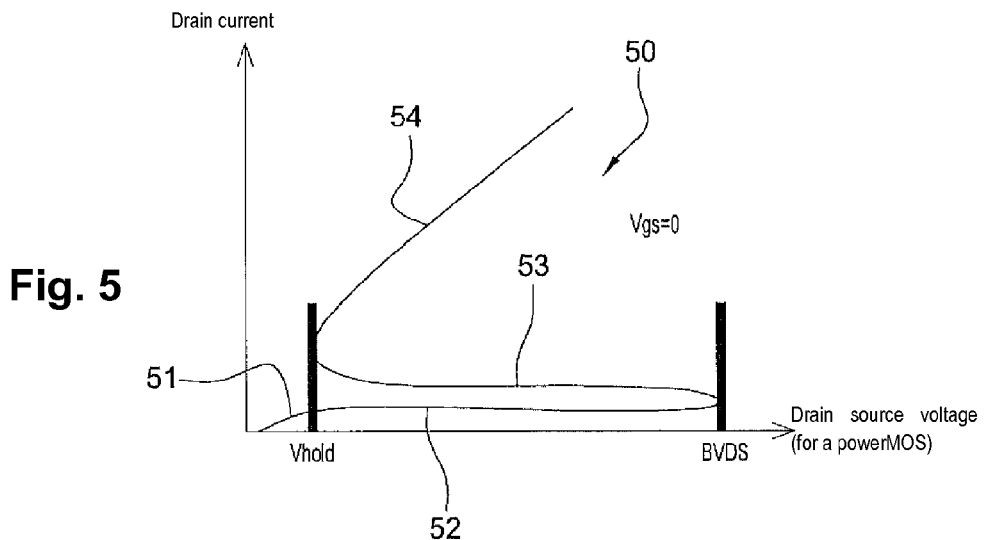
FIG. 5: A schematic representation of the change to the drain current based on the source drain voltage for a power MOSFET, according to one embodiment of the invention.

FIG. 5 is a schematic representation of the variation of the drain current based on the drain source voltage for such an N-channel power MOSFET transistor. On this graph 50, there are two very important parameters for determining the sensitivity of the power component to radiation. These two parameters are the lowest voltage for which a particle or radiation with given characteristics may trigger a destructive mechanism, called Vhold herein, and the voltage above which the component breaks down electrically, called BVDS. As this figure shows, when the value of the drain source voltage is less than Vhold, there is only one possible state 51 of the drain current. When the value of the drain source voltage is between the Vhold and BVDS values, the transistor has three possible current states 52, 53, 54. A first state, called a blocked state, is the lowest value current. A second state, called an instable state, is the intermediate current value. A third state, called a high current state, is a state where a failure was triggered.

The BVDS value is also very useful in the measurement. When the drain source voltage exceeds this value, the electric field becomes large enough to trigger a destructive current amplification mechanism itself.

Figure 6:
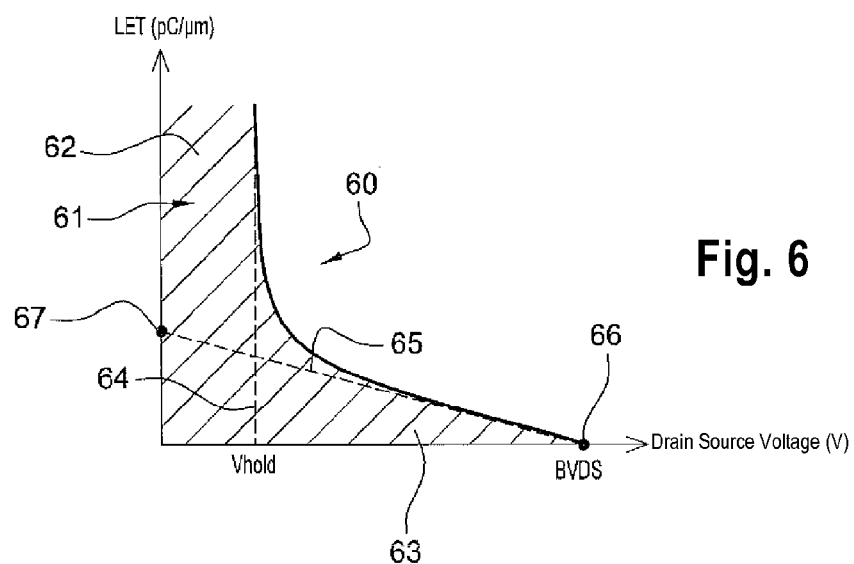
FIG. 6: A schematic representation of the expected curves for the charge by unit of length of the particle in a power MOSFET component based on the source drain voltage, according to one embodiment of the invention.

FIG. 6 is a schematic representation 60 of a characterization of the variation of the voltage range 61 (dotted line in FIG. 6) beyond which destructive events may be triggered by radiation or any other means of injecting charges into an electronic component (laser, CEM, etc.). In the SOA voltage range 61, and for the characteristics of the particle or means of injecting charges, there may not be an event triggered that is destructive to the component.

The graph 60 thus shows two separate areas in an area with asymptomatic behavior for voltage levels that are lower than Vhold. Behavior that is similar to linear behavior with a negative slope between Vhold and BVDS and which cuts the x-axis at the BVDS value positioned on the value of LET or the energy of the particle in the component, is null.

Figure 7:
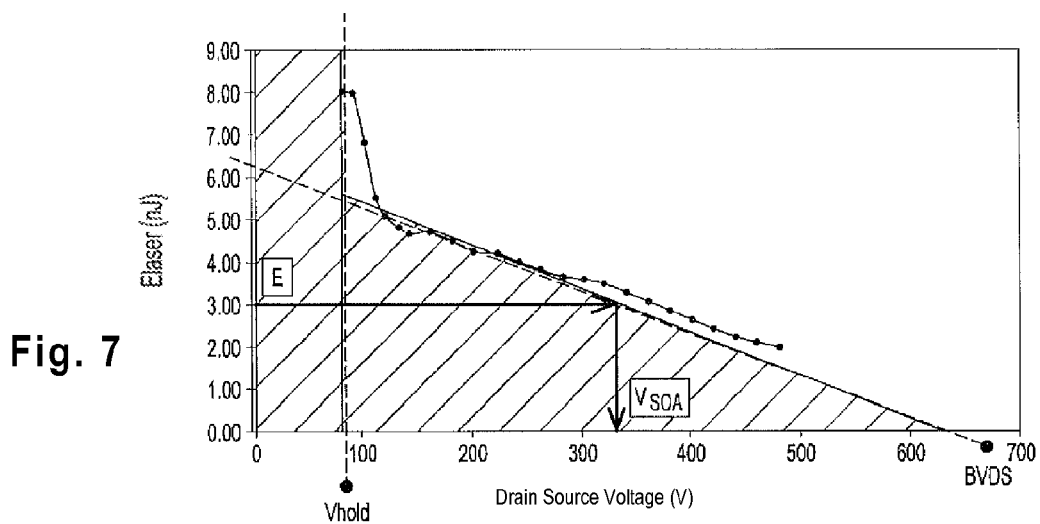
FIG. 7: Graphs representing the level of laser energy required to trigger a destructive event in a power MOSFET based on the applied source drain voltage, according to one embodiment of the invention.

FIG. 7 is an illustration of an experimental graph providing the level of laser energy based on the voltage applied for a 500V power MOS standard. This gives us the main characteristics shown on the schematic representation in FIG. 6, including the SOA voltage range.

The BVDS value obtained by experiment for radiation and by laser differs slightly from the value provided by the manufacturer because it is possible that the electrical breakdown affects structures other than the power cells.

It is also important to account for production variability, which introduces variations in the BVDS value (electrical) and in the BVDS value (radiation). However, it appears that the values are rather close in practice.

Thus, as shown in FIG. 6, the characteristic graph 60 showing the variation of the LET value or of threshold energy from which point a destructive event may be triggered based on the level of polarization can be modeled simply by two lines 64, 65. The first line 64 is vertical, and its x-axis is determined by performing an electrical characterization of the Vhold maintenance voltage. The second line 65 requires two points 66, 67 in order to be well defined. The first point 66 is obtained by electrically characterizing the BVDS breakdown voltage. The second point 67 must be obtained by experiment, using a laser or by performing a particle accelerator test.

With the two lines defined, it is then possible to predict the variation of the threshold voltage above which destructive events may be triggered, based on the characteristics of the incident particle (or laser).

Other, more detailed models may also be used to describe the theoretical variation behavior expected between the LET or threshold energy allowing an SEB to be triggered and the component's polarization voltage, also called the drain source voltage or VDS. These models are based on parameters that can be determined by knowing the electrical characterization of the structure, including BVDS and Vhold, and by obtaining an experimental point obtained in a particle accelerator or by laser.

Moreover, this model can be paired with a prediction code, such as the prediction code known as SMC DASIE. This SMC DASIE ("Simplified Monte Carlo Detailed Analysis of Secondary Ion Effects") prediction code was described in "A review of DASIE codes family: contribution to SEU/MBU understanding" by G. Hubert et al., published in "11th IEEE International On-Line Testing Symposium" in 2005, which is incorporated herein by reference in its entirety. A version dedicated to power components, power DASIE, is presented in Aurore Luu's thesis entitled "Méthodologie de prédiction des effets destructifs dus à l'environnement radiatif naturel sur les MOSFETs et IGBTs de puissance" (University of Toulouse—thesis submitted Nov. 12, 2009), which is incorporated herein by reference in its entirety. The various versions of this code are based on the same principle, the use of nuclear databases, paired with charge collection models and effect triggering criteria. The laser extracts method and sensitivity data when localized charges are injected for a specific component of initially unknown technology. These Monte Carlo calculation tools randomly select from a wide range of interactions that reproduce possible ionizing conditions resulting from heavy ion interaction or from neutron or proton nuclear reactions with the cores comprising the component. They therefore calculate the frequency of errors (SER, Single Event Rate).

This prediction code is therefore used according to the invention to perform gateway predictions between the different types of particles, as illustrated in FIGS. 8a, 8b. In the example used in these figures, heavy ion results are used as input to the DASIE power code to predict the sensitivity of neutron and proton environments.

For some power components and more particularly for components with a high current rating, it is very difficult to avoid the destructive character of radiation events despite the use of protection. When a test is performed using a particle accelerator, a very high number of components of the same reference must be tested in order to have a sufficient event statistic to minimize margins of error and uncertainties. For example, in terms of statistics, 20 destroyed components will produce a result with an uncertainty of about 30%, in accordance with the JEDEC ("Joint Electron Device Engineering Council") radiation test standard.

The method according to the invention also greatly limits how many samples are required to obtain a good event statistic.

This method is based on characterizing the frequency of amplified transient events occurring for test conditions performed in the safe area within the SOA voltage range.

FIGS. 9a to 9d show the different types of events or mechanisms that can be triggered by laser for test conditions in and out of the SOA voltage range.

In FIGS. 9a-9b and 9c-9d, for the test conditions in the SOA voltage range, there are two types of transient events or SET with distinct magnitudes, which are the amplified and the unamplified transient events, respectively.

Whether transient events are amplified for the test conditions in the SOA voltage range depends on the impact location of the particle or laser on the electronic component (and the related or unrelated triggering of current maintenance or amplification structures).

The example in FIG. 9a shows an amplified transient event with voltage Vhold, in the SOA voltage range, at 80V for this component.

The example in FIG. 9b shows a transient event outside of the SOA voltage range (at 200V for this component), with the same impact location as a triggered destructive event.

The example in FIG. 9c shows an unamplified transient event with voltage Vhold, in the SOA voltage range, at 80V for this component.

The example in FIG. 9d shows a transient event outside of the SOA voltage range (at 200V for this component), with the same impact location as no triggered destructive events.

Figure 10:
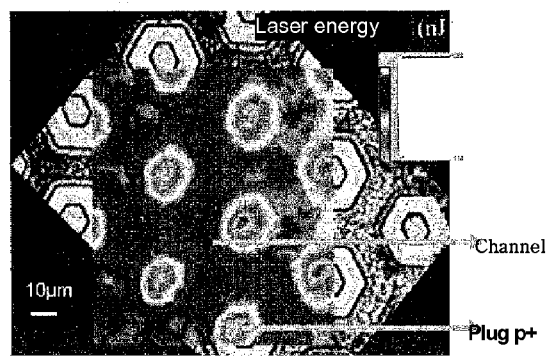
FIG. 10: A schematic representation of an identification by laser of areas of a 500V power MOSFET transistor's sensitivity to the SEB, according to one embodiment of the invention.

It is known, for power MOSFET components, that the areas that are most sensitive to destructive mechanisms triggered by radiation are at the channel of the cell of a power component and that the area of the plug p+, as shown in FIG. 10, is a very low-sensitivity area. One of the reasons why the areas around the channel are sensitive to destructive events is that such areas promote the triggering of bipolar amplification structures formed by the source, the well P, and the drain of power components. These are the same areas that, for test conditions in the SOA voltage range, will trigger amplified transient events. On the contrary, impacts near the plug p+ area will only trigger unamplified events.

FIG. 10 shows an identification by laser of areas that are sensitive to the phenomenon of maintaining an SEB or parasitic current with a power MOSFET of 500V. It appears in this figure that the amplified SET or transient events obtained for test conditions in the SOA voltage range are directly related to destructive events triggered outside of this said domain. Characterizing the probability of these amplified transient events occurring allows us to estimate the occurrence of expected destructive events outside of the SOA voltage range. For this reason, amplified SET transient events will be called precursor SETs in the remainder of the text.

Because this characterization is carried out on transient events, there is no damage to components. It is therefore possible to perform a test with a higher number of events in order to reduce the uncertainties associated with the probabilistic nature of radiation phenomena, while reducing the number of samples needed to produce a good event statistic as in the prior art.

Figure 11:
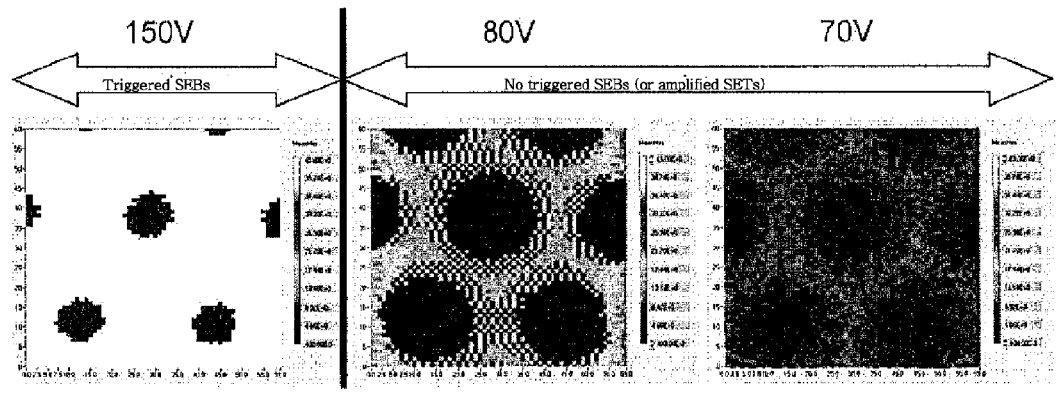
FIG. 11: A representation of laser maps of precursor SET transient events and SEB parasitic current amplification and maintenance phenomena of a power MOSFET.

FIG. 11 shows the laser mapping of precursor SET transient events and SEB parasitic current maintenance phenomena, performed on 500V power MOSFETs for drain source voltages in an SOA voltage radio between 70V and 80V, along with a drain source voltage of 150V when laser mapping is performed outside of the SOA voltage range.

There is very good agreement between the location of areas of sensitivity to the precursor SETs and areas of sensitive to SEB.

This function confirms that the areas causing the highest magnitude of SETs for test conditions within the SOA voltage range are those that will trigger destructive events for test conditions outside of said range.

Figure 12:
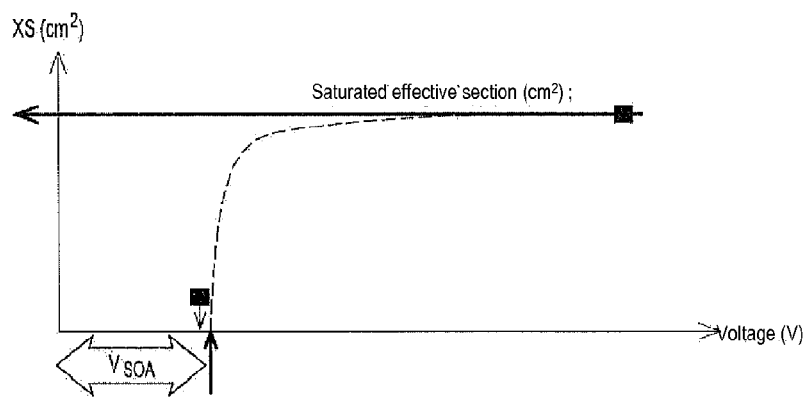
FIG. 12: A schematic representation for various levels of voltage of the varying efficient section of destructive events on the component based on the measured magnitude of the event.

The graph in FIG. 12 shows, for various levels of voltage of the varying efficient section of destructive events on the component or population of destructive events based on the measured magnitude of the event. For the 60V, 80V, 90V, and 100V curves, there are clearly two types of populations in terms of SET transient events.

For the 80V curve in the SOA voltage range, there are only transient events, with no destructive events. These transient events fall into two categories:

Events with a magnitude of less than 4V are unamplified SET transient events.

Events with a magnitude of greater than 12V are precursor SET transient events.

As shown in FIG. 11, most impact locations on the component for which the transient events have a magnitude of less than 4V will not trigger an SEB for voltage levels outside the SOA voltage range. Conversely, most locations for which SET transient events have a magnitude of greater than 12V will trigger SEBs.

The test method according to the invention using a test device and laser or particle accelerator is therefore as follows:

Determination of the SOA voltage range for the characteristics of the incident beam or particle. This determination will cause the destruction of one maximum component.

For characteristics of the incident beam or particle, perform a test with a particle accelerator or laser for conditions that are similar to the internal limitations of the predetermined SOA voltage range.

Characterization of the efficient section of precursor SET transient events. As shown above, the efficient section of the amplified SET transient events is a very good estimate of the effective section of the destructive elements.

Possible use of this effective section estimate as input to a prediction code to extrapolate the sensitivity for other types of particles relative to the use conditions.

The method is repeated for the component's other test conditions, like the incident of the particle or laser, the characteristics of said particle or said radiation, etc.

In FIG. 12, for an energy level (equivalently, for a characterization obtained in a particle accelerator, for a neutron or proton energy or for a given LET level), the first part of the method can determine the VSOA voltage, which is the voltage below which, given the characteristics of the particle relative to the incident beam, it is not possible to trigger destructive events. The second part of the method indicates whether to go just below the VSOA voltage to characterize the precursor events and to accurately determine the effective section value saturated with destructive events.

These two parameters are enough to then be able to compare the sensitivity of different components and to perform calculations of the expected failure rates.

The invention claimed is:

1. A method for characterizing the sensitivity of an electronic component to a natural radiation environment, comprising the steps of:
    turning on the electronic component;
    determining, for characteristics of an incident beam or particle, a safe operating area (SOA) voltage range beyond which destructive events occur to the electronic component;
    exciting the electronic component with the incident beam or particle under operating conditions just below the operation conditions of a highest voltage in the determined SOA voltage range;
    determining an effective section of amplified transient events occurring within the determined SOA voltage range, the effective section corresponding to an estimate of an occurrence of an event destructive to the electronic component;
    modifying the characteristics of the incident beam or particle; and
    repeating the steps of exciting the electronic component with the modified incident beam and particle, and determining the effective section for the incident beam or particle with the modified characteristics when one or more amplified transient events are triggered.

2. The method of claim 1, wherein the step of determining the effective section comprises the step of applying at least one of the following test conditions to the electronic component: polarizations, a duty cycle ratio, a dynamic operating condition, frequency, or temperature.

3. The method of claim 1, wherein the step of determining the SOA voltage range of the electronic component comprises the step of determining electrical characteristics of a parasitic current based on a voltage applied to an output electrode of the electronic component when the electronic component is in a blocked state.

4. The method of claim 1, wherein the step of determining the SOA voltage range of the electronic component comprises the step of determining electrical characteristics that change a current of an output electrode of the electronic component based on a voltage applied to the output electrode when the electronic component is in a blocked state.

5. The method of claim 1, further comprising the step of measuring probability of a failure of the electronic component from the effective sections.

6. The method of claim 1, wherein the step of exciting the electronic component utilizes laser radiation, a particle accelerator, or a means for injecting charges.

7. The method of claim 1, wherein the step of determining SOA voltage range determines the SOA voltage range based on at least one of the following destructive events: single event burnout (SEB), latchup, an event triggering a parasitic bipolar structure, an event triggering maintenance mechanisms or an event amplifying a current.

8. The method of claim 1, further comprising the step of determining the SOA voltage range for at least one of the characteristics of the incident beam or particle: energy, incidence or path.

9. The method of claim 1, further comprising the step of utilizing the effective section as an input to a prediction code.

10. The method of claim 1, further comprising the step of utilizing the effective section as an input to a Simplified Monte Carlo Detailed Analysis of Secondary Ion Effects (SMC DASIE) prediction code.

11. A test device for characterizing the sensitivity of an electronic component to a natural radiation environment, comprising:
- a laser or a particle accelerator to generating an incident beam or particle;
- a processor to determine, for characteristics of the incident beam or particle, a safe operating area (SOA) voltage range beyond which destructive events occur to the electronic component;
- wherein the laser or particle accelerator excites the electronic component with the incident beam or particle under operating conditions just below the operation conditions of a highest voltage in the determined SOA voltage range;
- a measurement device for measuring at least current and voltage of an electrode of the excited electronic component to provide measurements;
- wherein the processor determines an effective section of amplified transient events occurring within the determined SOA voltage range from the measurements, the effective section corresponding to an estimate of an occurrence of an event destructive to the electronic component;
- wherein the laser or particle accelerator modifies the characteristics of the incident beam or particle, and excites the electronic component with the modified incident beam or particle;
- wherein the measurement device measures said at least current and voltage of the electrode of the electronic component excited with the modified incident beam or particle to provide new measurements; and
- wherein the processor determines the effective section from the new measurements when one or more amplified transient events are triggered.

12. The test device according to claim 11, further comprising a conditioning device for applying at least one of the following test conditions to the electronic component during the determination of said component's effective section: polarizations, a duty cycle ratio, a dynamic operating condition, frequency, or temperature.

13. The test device according to claim 11, wherein the processor uses the effective section as an input to a Simplified Monte Carlo Detailed Analysis of Secondary Ion Effects (SMC DASIE) prediction code.

14. A method for characterizing the sensitivity of an electronic component to a natural radiation environment, comprising the steps of:
- turning on the electronic component;
- determining, for characteristics of an incident beam or particle, a safe operating area (SOA) voltage range beyond which destructive events occur to the electronic component;
- exciting the electronic component with the incident beam or particle under operating conditions just below the operation conditions of a highest voltage in the determined SOA voltage range;
- applying one or more test conditions to the electronic component while determining an effective section of amplified transient events occurring within the determined SOA voltage range, the effective section corresponding to an estimate of an occurrence of an event destructive to the electronic component, and the test conditions being polarizations, duty cycle ratios, dynamic operating conditions, frequencies, or temperatures;
- modifying the characteristics of the incident beam or particle;
- repeating the steps of exciting the electronic component with the modified incident beam and particle, and determining the effective section for the incident beam or particle with the modified characteristics when one or more amplified transient events are triggered; and
- utilizing the effective section as an input to a Simplified Monte Carlo Detailed Analysis of Secondary Ion Effects (SMC DASIE) prediction code.

15. The method of claim 14, wherein the step of determining the SOA voltage range of the electronic component comprises the step of determining electrical characteristics of a parasitic current based on a voltage applied to an output electrode of the electronic component when the electronic component is in a blocked state.

16. The method of claim 14, wherein the step of determining the SOA voltage range of the electronic component comprises the step of determining electrical characteristics that change a current of an output electrode of the electronic component based on a voltage applied to the output electrode when the electronic component is in a blocked state.

17. The method of claim 14, further comprising the step of measuring probability of a failure of the electronic component from the effective sections.

18. The method of claim 14, wherein the step of exciting the electronic component utilizes laser radiation, a particle accelerator, or a means for injecting charges.

19. The method of claim 14, wherein the step of determining SOA voltage range determines the SOA voltage range based on at least one of the following destructive events: single event burnout (SEB), latchup, an event triggering a parasitic bipolar structure, an event triggering maintenance mechanisms or an event amplifying a current.

20. The method of claim 14, further comprising the step of determining the SOA voltage range for at least one of the characteristics of the incident beam or particle: energy, incidence or path.

* * * * *